US008760818B1

(12) United States Patent
Diao et al.

(10) Patent No.: US 8,760,818 B1
(45) Date of Patent: Jun. 24, 2014

(54) SYSTEMS AND METHODS FOR PROVIDING MAGNETIC STORAGE ELEMENTS WITH HIGH MAGNETO-RESISTANCE USING HEUSLER ALLOYS

(71) Applicant: Western Digital (Fremont), LLC, Fremont, CA (US)

(72) Inventors: Zhitao Diao, Fremont, CA (US); Qunwen Leng, Palo Alto, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/737,374

(22) Filed: Jan. 9, 2013

(51) Int. Cl.
*G11B 5/39* (2006.01)
(52) U.S. Cl.
USPC .......................................... 360/313
(58) Field of Classification Search
USPC .......................................... 360/313
See application file for complete search history.

(56) References Cited

U.S. PATENT DOCUMENTS

| 4,828,966 | A | 5/1989 | Mallary et al. |
| 6,375,761 | B1 | 4/2002 | Gambino et al. |
| 6,707,649 | B2 | 3/2004 | Hasegawa et al. |
| 6,828,897 | B1 | 12/2004 | Nepela |
| 7,042,686 | B2 | 5/2006 | Hiramoto et al. |
| 7,310,207 | B2 | 12/2007 | Hasegawa et al. |
| 7,310,208 | B2 * | 12/2007 | Hasegawa et al. ....... 360/324.11 |
| 7,336,451 | B2 | 2/2008 | Saito |
| 7,336,453 | B2 | 2/2008 | Hasegawa et al. |
| 7,466,525 | B2 | 12/2008 | Hasegawa et al. |
| 7,480,122 | B2 | 1/2009 | Ide et al. |
| 7,554,776 | B2 | 6/2009 | Hasegawa et al. |
| 7,558,028 | B2 | 7/2009 | Carey et al. |
| 7,602,592 | B2 | 10/2009 | Fukuzawa et al. |
| 7,667,933 | B2 | 2/2010 | Kudo et al. |
| 7,760,473 | B2 | 7/2010 | Ide et al. |
| 2005/0266274 | A1 | 12/2005 | Hasegawa et al. |
| 2006/0050444 | A1 | 3/2006 | Fukuzawa et al. |
| 2008/0239591 | A1 * | 10/2008 | Fuji et al. ................. 360/324.12 |
| 2010/0072529 | A1 | 3/2010 | Marukame et al. |
| 2012/0182647 | A1 * | 7/2012 | Fuke et al. ................. 360/313 |
| 2013/0128391 | A1 * | 5/2013 | Fuji et al. ................. 360/324.12 |

FOREIGN PATENT DOCUMENTS

| JP | 2004-146480 A | 5/2004 |
| JP | 2005-116703 A | 4/2005 |

OTHER PUBLICATIONS

J.R. Childress, et al., "All Metal Current-Perpendicular-to-Plane Giant Magnetoresistance Sensors for Narrow-Track Magnetic Recording", IEEE Transactions on Magnetics, vol. 44, No. 1, Jan. 2008, pp. 90-94.
T. Iwase, et al., "Large Interface Spin-Asymmetry and Magnetoresistance in Fully Epitaxial Co2MnSi/Ag/Co2MnSi Current-Perpendicular-to-Plane Magnetoresistive Devices", Appl. Phys. Exp., vol. 2, 2009, pp. 063003-063003-3.
J. Sato, et al., "Large Magnetoresistance Effect in Epitaxial Co2Fe0.4Mn0.6Si/Ag/Co2Fe0.4Mn0.6Si Devices", Appl. Phys. Exp., vol. 4, 2011, pp. 113005-113007.

* cited by examiner

*Primary Examiner* — Mark Blouin

(57) ABSTRACT

Systems and methods for providing magnetic storage elements with high magneto-resistance using Heusler alloys are provided. One such method includes depositing a substrate including NiFe, depositing a seed layer on the substrate, depositing a buffer layer on the seed layer, and growing, epitaxially, an upper layer on the buffer layer, the upper layer including a Heusler alloy.

13 Claims, 4 Drawing Sheets

SYSTEMS AND METHODS FOR PROVIDING MAGNETIC STORAGE ELEMENTS WITH HIGH MAGNETO-RESISTANCE USING HEUSLER ALLOYS

FIELD

The present invention relates generally to read sensors for magnetic disk drives, and more specifically to systems and methods for providing magnetic storage elements with high magneto-resistance using Heusler alloys.

BACKGROUND

Magnetic disk drives are used to store and retrieve data for digital electronic apparatuses such as computers. In FIGS. 1 and 2, a magnetic disk data storage system 10 includes a sealed enclosure 12, a disk drive motor 14, and a magnetic disk, or media, 16 supported for rotation by a drive spindle 17 of motor 14. Also included are an actuator 18 and an arm 20 attached to an actuator spindle 21 of actuator 18. A suspension 22 is coupled at one end to the arm 20 and at another end to a read/write head 24. The suspension 22 and the read/write head 24 are commonly collectively referred to as a head gimbal assembly (HGA). The read/write head 24 typically includes an inductive write element and a magneto-resistive read element that are held in a very close proximity to the magnetic disk 16. As the motor 14 rotates the magnetic disk 16, as indicated by the arrow R, an air bearing is formed under the read/write head 24 causing the read/write head to lift slightly off of the surface of the magnetic disk 16, or, as it is commonly termed in the art, to "fly" above the magnetic disk 16. Data bits can be written or read along a magnetic "track" of the magnetic disk 16 as the magnetic disk 16 rotates past the read/write head 24. The actuator 18 moves the read/write head 24 from one magnetic track to another by pivoting the arm 20 and the suspension 22 in an arc indicated by arrows P. The design of magnetic disk data storage system 10 is well known to those skilled in the art.

FIG. 3 shows a cross-sectional view of a read/write head 24. The read/write head 24 includes a write element 30 for writing data bits to the magnetic disk and a read element 32 for reading the data bits. The write element 30 includes a yoke 34 and one or more layers of electrically conductive coils 36 wound around the yoke 34. In operation, an electric current is passed through the coils 36 to induce a magnetic field in the yoke 34. The yoke 34 includes a lower pole 38 connected to an upper pole 40 by a back gap 42 at a back gap end. The lower and upper poles 38, 40 oppose each other across a write gap 44 at an air bearing end. The yoke 34 is commonly formed of ferromagnetic materials.

The read element 32 includes a first shield 46, a second shield 48, a read insulation layer 50 disposed between the first shield 46 and the second shield 48, and a read sensor 52 disposed within the read insulation layer 50 and exposed at an air bearing surface (ABS). In some designs, often referred to as "merged head" designs, second shield 48 and lower pole 38 are the same layer. In other designs, such as the one shown in FIG. 3, a thin insulating layer 54 separates the second shield 48 from the lower pole 38.

In existing read sensors (e.g., current perpendicular to plane or "CPP" giant magneto-resistance or "GMR" film stack read sensors) with conventional magnetic material such as CoFe and CoFeB, the read signal is small with limited CPP GMR ratio (less than 2% as usual) that does not meet requirements for large signal to noise ratio (SNR) applications. For those with Heusler alloy material based read sensor elements, a large CPP GMR ratio up to tens of percentage is available but with bulky stack design and epitaxial growth of films on crystalline oriented MgO (100) substrates. These read sensors are not suitable for hard drive and magneto-resistive random access memory (MRAM) applications in terms of requirements on small shield to shield spacing and improved performance of devices using such read sensors for high areal density recording.

Conventional efforts utilizing Heusler alloy materials in CPP GMR devices have explored widely the potential and possibility for enhanced output signal and largely improved SNR. However, the output signal from such devices remains on the low side, in particular for small shield to shield spacing form factors. The major challenges lie on the fact that crystal structure of Heusler alloy multi-layers need to be modulated such that they are compatible with L21/B2 ordering to realize half metallicity and large spin polarization with epitaxial growth of thin films. Accordingly, what is needed is an improved magnetic storage element that provides improved electrical performance while providing small shield to shield spacing on a NiFe substrate.

SUMMARY

Aspects of the invention relate to systems and methods for providing magnetic storage elements with high magneto-resistance using Heusler alloys. In one embodiment, the invention relates to a method for manufacturing a magnetic storage element, the method including depositing a substrate including NiFe, depositing a seed layer on the substrate, depositing a buffer layer on the seed layer, and growing, epitaxially, an upper layer on the buffer layer, the upper layer including a Heusler alloy.

In another embodiment, the invention relates to a magnetic storage element including a substrate including NiFe, a seed layer on the substrate, a buffer layer on the seed layer, and an upper layer on the buffer layer, the upper layer including a Heusler alloy grown epitaxially.

In one embodiment, the substrate has a first crystalline structure, and the seed layer and the buffer layer are configured to provide a foundation structure for the Heusler alloy of the upper layer that is different from the first crystalline structure.

DETAILED DESCRIPTION

Figure 1:
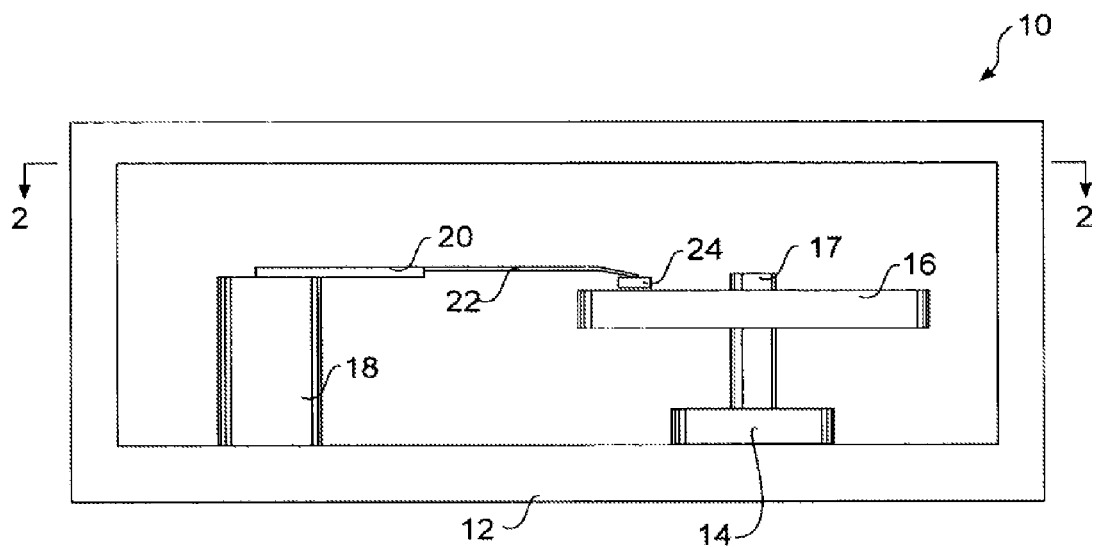
FIG. 1 is a partial cross sectional view of a magnetic data storage system in accordance with the prior art.
Figure 2:
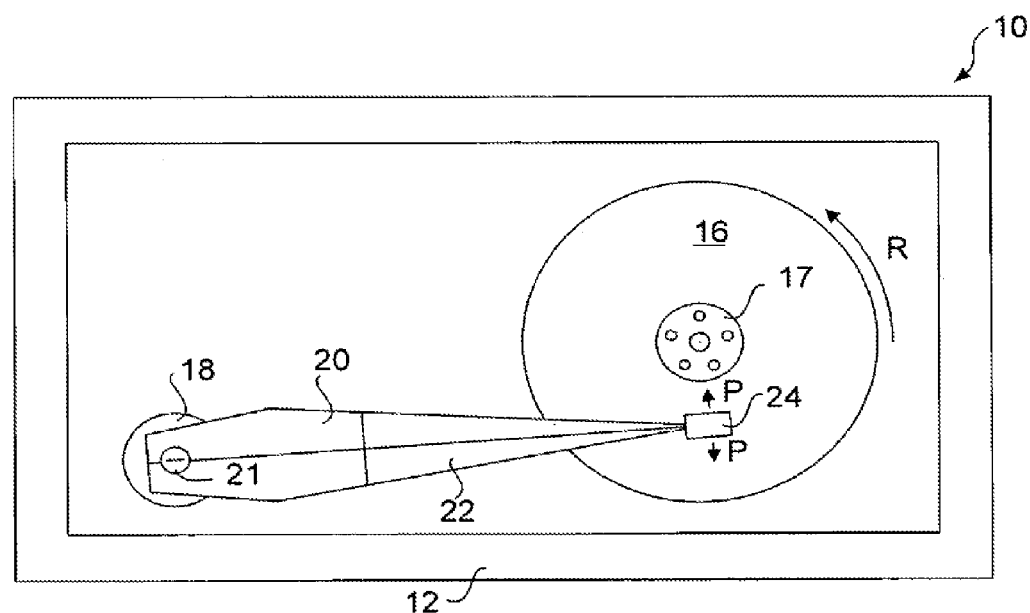
FIG. 2 is a partial cross sectional view taken along line 2-2 of FIG. 1 in accordance with the prior art.
Figure 3:
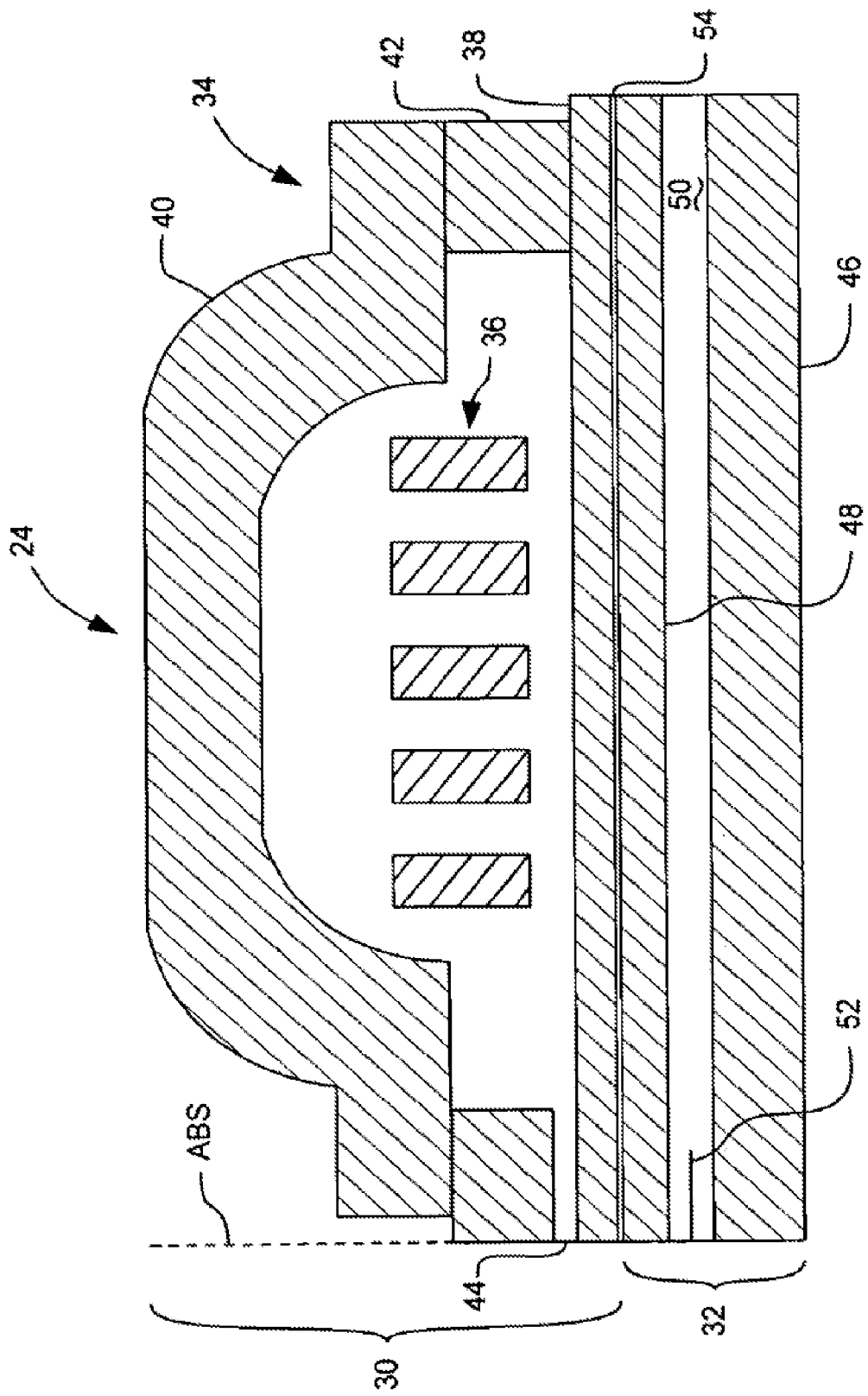
FIG. 3 is a cross sectional view of a read/write head in accordance with the prior art.

Referring now to the drawings, embodiments of systems and methods for providing magnetic storage elements with high magneto-resistance using Heusler alloys are illustrated. The systems include a substrate made of NiFe, a seed layer on the substrate, a buffer layer on the seed layer, and an upper layer on the buffer layer, where the upper layer includes a Heusler alloy grown epitaxially. The seed and buffer layers are configured to facilitate the epitaxial growth of the Heusler alloy with a crystalline structure that is substantially independent of that of the NiFe substrate. In many embodiments, the systems can include additional layers (e.g., free layer, reference layer, spacer layer, and/or capping layer) in various configurations to form a top spin valve, a bottom spin valve, or a pseudo spin valve magnetic storage element. The methods include processes for forming these magnetic storage elements.

In several embodiments, the Heusler alloy has a L21/B2 ordering and/or includes a $Co_2Fe_xMn_{1-x}Si$ or CFMS alloy, where x is between 0 and 1. The improved magnetic storage elements can provide enhanced electrical characteristics such as high magneto-resistance and signal output while also providing enhanced physical characteristics such as thin Heusler layer stacking that results in small shield to shield spacing.

Figures 4, 5:
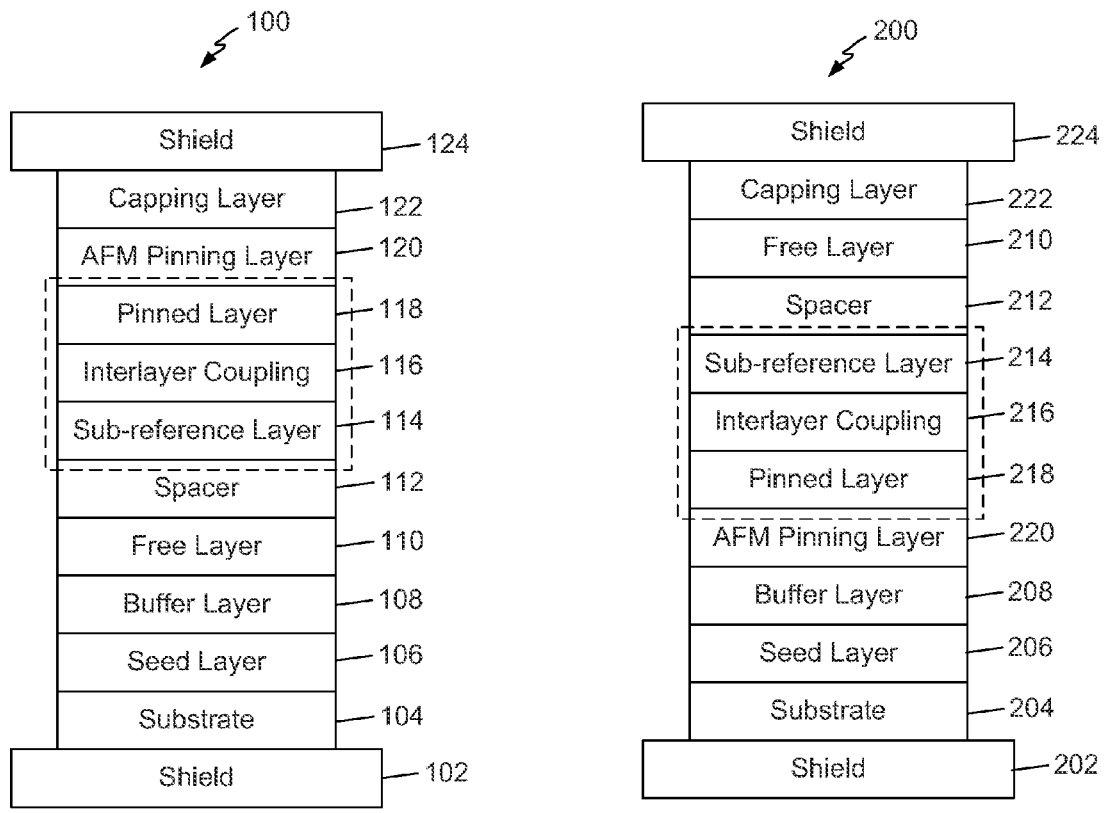
FIG. 4 is a cross sectional view of a magnetic storage element with high magneto-resistance in a top spin valve configuration with seed and buffer layers on a NiFe substrate that are configured to support formation of one or more Heusler alloy layers in accordance with one embodiment of the invention.
FIG. 5 is a cross sectional view of a magnetic storage element with high magneto-resistance in a bottom spin valve configuration with seed and buffer layers on a NiFe substrate that are configured to support formation of one or more Heusler alloy layers in accordance with one embodiment of the invention.

FIG. 4 is a cross sectional view of a magnetic storage element 100 with high magneto-resistance in a top spin valve configuration with seed and buffer layers on a NiFe substrate that are configured to support formation of one or more Heusler alloy layers in accordance with one embodiment of the invention. The magnetic storage element 100 includes a multi-layer stacked structure with a bottom shield layer 102, a substrate 104 on the bottom shield layer 102, a seed layer 106 on the substrate 104, a buffer layer 108 on the seed layer 106, a free layer 110 on the buffer layer 108, a spacer layer 112 on the free layer 110, a sub-reference layer 114 on the spacer layer 112, an interlayer coupling layer 116 on the sub-reference layer 114, a pinned layer 118 on the interlayer coupling layer 116, an anti-ferromagnetic (AFM) pinning layer 120 on the pinned layer 118, a capping layer 122 on the AFM pinning layer 120, and a top shield layer 124 on the capping layer 122.

In several embodiments, the sub-reference layer 114, the interlayer coupling layer 116, and the pinned layer 118 are collectively referred to as the reference layer. In several embodiments, the AFM pinning layer 120 is an optional layer.

The bottom and top shield layers (102, 124) are made of suitable shield materials known in the art. The substrate 102 is made of NiFe and other suitable materials. The seed layer 106 can be made of a multi-layer structure that includes one or more materials such as NiFe, Ta, Ti, amorphous CoFeB, CoFe, a material including a magnetic CFMS Heusler alloy, and combinations thereof. In one embodiment, the seed layer 106 is made of a bottom NiFe layer that is about 2 nanometers (nm) thick, a CoFeB layer that is about 2 nm thick, and a CoFe layer that is about 4.5 nm thick. In other embodiments, other suitable layers and thicknesses can be used. The buffer layer 108 can be made of a multi-layer structure that includes one or more materials such as Ta, Ti, Cr, Ru, Cu, Ag, Al, W, a Ta alloy, a Cr alloy, a Ru alloy, a Cu alloy, a Ag alloy, a W alloy, a NiAl alloy, and combinations thereof.

In one embodiment, buffer layer 108 is made of a bottom Cr layer that is about 1 nm thick and a Ag layer that is about 1 nm thick. In such case, the seed layer 106 can be made of a bottom NiFe layer that is about 2 nanometers (nm) thick, a CoFeB layer that is about 2 nm thick, and a CoFe25 layer that is about 4.5 nm thick. In such case, the NiFe layer of the seed layer 106 provides a contact layer for wafer substrate 104 for adhesion and stress adjustment. The CoFeB provides an amorphous platform upon which the CoFe25 layer is grown to form a body-centered cubic (BCC) like structure. On the top of these seed layers 106, the buffer layer 108 of Cr/Ag is grown to provide (110) orientated texture and lattice match with Heusler alloy layers (e.g., free layer 110) that are to be grown epitaxially.

The free layer 110 can be a single or multi-layer structure made of one or more Heusler alloys grown epitaxially on the buffer layer 108. The Heusler alloys can have a L21/B2 ordering and/or include a $Co_2Fe_xMn_{1-x}Si$ or CFMS alloy, where x is between 0 and 1. The spacer layer 112 can be made of suitable materials known in the art. The sub-reference layer 114 can be a single or multi-layer structure made of Co, Fe, CoFe, and/or one or more Heusler alloys grown epitaxially on the spacer layer 112. The Heusler alloys can have a L21/B2 ordering and/or include a CFMS alloy. The interlayer coupling layer 116 can be made of Ru, Cr, Cu, Ta, Ag, and/or other suitable materials known in the art. The pinned layer 118 can be made of Co, Fe, CoFe, one or more Heusler alloys, and/or other suitable ferromagnetic materials. The AFM pinning layer 120 can be made of anti-ferromagnetic materials such as IrMn, FeMn, PtMn, and/or other suitable materials known in the art. The capping layer 122 can be made of Ru, Ta, Ti, and/or other suitable materials known in the art.

In several embodiments, the seed layer 106 and buffer layer 108 are configured to facilitate an epitaxial growth of the Heusler alloy of the free layer 110. More specifically, the seed layer 106 can be configured to substantially obstruct a transfer of a first crystalline structure of the substrate 104 to the buffer layer 108 and the free layer 110, thereby preventing the transfer of the first crystalline structure to the Heusler alloy of the free layer 110. In several embodiments, the seed layer 106 is configured to provide a second crystalline structure different from the first crystalline structure of the NiFe substrate 104. In such case, the buffer layer 108 is configured to substantially maintain the second crystalline structure of the seed layer 106, and a crystalline structure of the free layer 110 (e.g., Heusler alloy) grown epitaxially on the buffer layer 106 should substantially match the second crystalline structure of the buffer layer 108 and the seed layer 106. In one embodiment, the first crystalline structure has a face-centered cubic (FCC) structure, and the second crystalline structure has a structure that is about body-centered cubic (BCC).

In some embodiments, the seed layer 106 includes a first magnetic sub-layer with an amorphous structure and a second magnetic sub-layer with the second crystalline structure that is about body-centered cubic. In such case, the second crystalline structure is developed through a process for changing the amorphous structure of the first magnetic sub-layer, where the process is an annealing process, a phase change process, a re-crystallization process, a combination of those processes, and/or another suitable process known in the art.

In a number of embodiments, the seed layer 106 and the buffer layer 108 are configured to provide a foundation structure for the Heusler alloy of the free layer 110 (e.g., upper layer) that is different from the first crystalline structure of the NiFe substrate 104. In several embodiments, the seed layer 106 has substantially magnetic characteristics, and the buffer layer 108 has substantially non-magnetic characteristics.

In one embodiment, the buffer layer 108 includes one or more materials selected from the group consisting of Cu2CrAl, Cu2AlSi, a material including a non-magnetic Heusler alloy, and combinations thereof. In several embodiments, the magnetic storage element 100 is a current perpendicular to plane (CPP) giant magneto-resistance (GMR) reader. In some embodiments, the substrate 104 and the seed layer 106 can act as a shield layer for the GMR reader. In some embodiments, one or both of shield layers (102, 124) are omitted.

In a number of embodiments, magnetic seed layers, buffer layers and their combined structure provide a platform and base on which the Heusler alloy multi-layers and stacks are grown expitaxially to maximize the crystalline structure match and enhance L21/B2 ordering and stoichiometric homogeneity. In one such case, the magnetic seed layers can also act as part of the shielding and the use of which can be optional for MRAM applications but preferable for hard drive applications.

In one embodiment, the total Heusler alloy layers are less than 15 nm in thickness. In one embodiment, the maximum CPP GMR ratio is about 9.0 and 13.0% for a device, corresponding to a maximum change in RA of about 4.5 and 7.0 $m\Omega\mu m^2$, respectively. In one embodiment, the maximum CPP GMR of 13.0% and change in RA of about 9.0 $m\Omega\mu m^2$ are obtained for a CPP GMR device.

In another embodiment, the reference/pinned layers have multi-layer structures. They consist of two ferromagnetic layers anti-ferromagentically coupled by nonmagnetic coupling metal layers. The FM layers are made of Co, Fe, or Ni or their alloy or Heusler alloy layers. The interlayer coupling layers can be nonmagnetic metals (their alloys) such as Ru, Cr, Cu, Ta, and Ag. An optional intermediate layer can be included as a thin interfacial layer of less than 20 Angstroms in thickness can be inserted in between the ferromagnetic and interlayer coupling layer. The intermediate layers are preferably made of magnetic metals or alloys that can enhance interlayer coupling and set forth texture and crystalline structures of the magnetic Heusler alloy layers and other magnetic layers.

In one embodiment, the epitaxial growth of the stacking layers (e.g., Fe/Cr SAF pinned layers) up to the top Heusler layer CFMS follows the orientation relationship of CFMS (110) [001], Ag (110) [111], CFMS (110) [111] for a CPP GMR device. In such case, a resultant modulated crystalline structure with homogeneity in stoichiometry, of the device utilizing the Fe/Cr SAF pinned layers, improves homogeneity in the long-range ordering, and eventually the CPP GMR and device performance.

In several embodiments, the magnetic storage elements provide for large spin polarization and CPP GMR in magnetic elements utilizing Heusler systems, and the signal output on such devices is achieved with highly ordered L21/B2 Heusler phase using low temperature processes. With the improved epitaxial growth of CPP GMR films and modulated Heusler alloy composition, the magnetic ordering temperature is reduced for maximizing GMR and device performance for thin stack designs, while having scalability of device design to increase recording density.

In several embodiments, the magnetic storage elements provide for reduced shield-to-shield spacing (e.g., reduced by up to 10 nm as compared to conventional magnetic storage elements) and GMR gain up to two times conventional gain. In several embodiments, the large output signal and amplitude are available at low bias applied on the device, facilitating noise reduction including those from the spin transfer torque (STT) effect, and enhancement of SNR. In several embodiments, the improved magnetic storage elements can be used with MRAM device development and manufacturing in addition to hard drive applications.

FIG. 5 is a cross sectional view of a magnetic storage element 200 with high magneto-resistance in a bottom spin valve configuration with seed and buffer layers on a NiFe substrate that are configured to support formation of one or more Heusler alloy layers in accordance with one embodiment of the invention. The magnetic storage element 200 includes a multi-layer stacked structure with a bottom shield layer 202, a substrate 204 on the bottom shield layer 202, a seed layer 206 on the substrate 204, a buffer layer 208 on the seed layer 206, an AFM pinning layer 220 on the buffer layer 208, a pinned layer 218 on the AFM pinning layer 220, an interlayer coupling layer 216 on the pinned layer 218, a sub-reference layer 214 on the interlayer coupling layer 216, a spacer layer 212 on the sub-reference layer 214, a free layer 210 on the spacer layer 212, a capping layer 222 on the free layer 210, and a top shield layer 224 on the capping layer 222.

In several embodiments, the sub-reference layer 214, the interlayer coupling layer 216, and the pinned layer 218 are collectively referred to as the reference layer. In several embodiments, the AFM pinning layer 220 is an optional layer.

In a number of embodiments, the materials and function of the layers of the magnetic storage element 200 can be the same, or substantially the same, as those described above for the magnetic storage element 100 of FIG. 4. In addition, the magnetic storage element 200 can also include the variations described above for the magnetic storage element 100 of FIG. 4.

Figure 6:
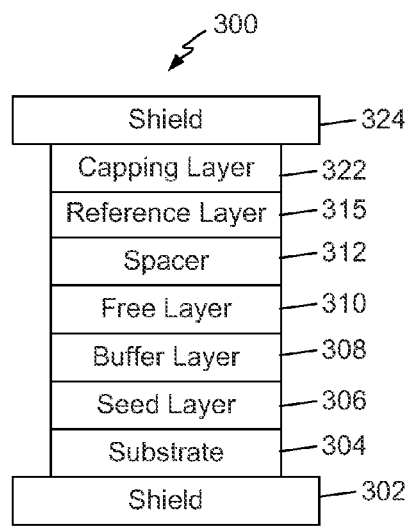
FIG. 6 is a cross sectional view of a magnetic storage element with high magneto-resistance in a pseudo spin valve configuration with seed and buffer layers on a NiFe substrate that are configured to support formation of one or more Heusler alloy layers in accordance with one embodiment of the invention.

FIG. 6 is a cross sectional view of a magnetic storage element 300 with high magneto-resistance in a pseudo spin valve configuration with seed and buffer layers on a NiFe substrate that are configured to support formation of one or more Heusler alloy layers in accordance with one embodiment of the invention. The magnetic storage element 300 includes a multi-layer stacked structure with a bottom shield layer 302, a substrate 304 on the bottom shield layer 302, a seed layer 306 on the substrate 304, a buffer layer 308 on the seed layer 306, a free layer 310 on the buffer layer 308, a spacer layer 312 on the free layer 310, a reference layer 315 on the spacer layer 312, a capping layer 322 on the reference layer 315, and a top shield layer 324 on the capping layer 322.

In a number of embodiments, the materials and function of the layers of the magnetic storage element 300 can be the same, or substantially the same, as those described above for the magnetic storage element 100 of FIG. 4. In addition, the magnetic storage element 300 can also include the variations described above for the magnetic storage element 100 of FIG. 4.

Figure 7:
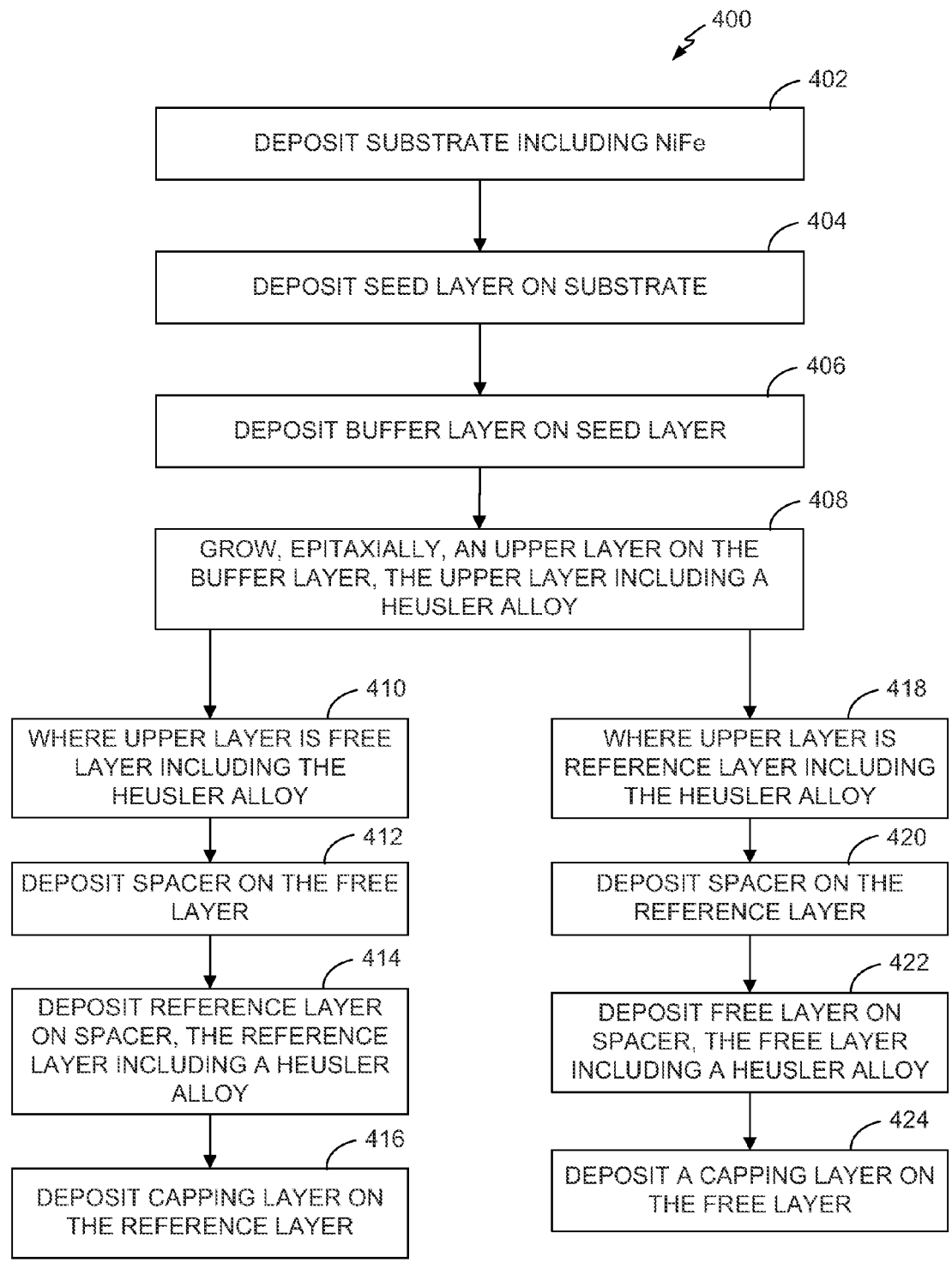
FIG. 7 is a flowchart of a process for forming a magnetic storage element with high magneto-resistance having seed and buffer layers on a NiFe substrate that are configured to support formation of one or more Heusler alloy layers in accordance with one embodiment of the invention.

FIG. 7 is a flowchart of a process 400 for forming a magnetic storage element with high magneto-resistance having seed and buffer layers on a NiFe substrate that are configured to support formation of one or more Heusler alloy layers in accordance with one embodiment of the invention. In particular embodiments, the process 400 can be used to form one or more of the magnetic storage elements of FIGS. 4-6. The process first deposits (402) a substrate including NiFe. In some embodiments, the substrate can be deposited on a shield. In other embodiments, the substrate can act as a shield. The process then deposits (404) a seed layer on the substrate. The process then deposits (406) a buffer layer on the seed layer. In several embodiments, the seed layer and buffer layer are configured to facilitate an epitaxial growth of a Heusler alloy about to be deposited. The process then grows (408), epitaxially, an upper layer on the buffer layer where the upper layer includes a Heusler alloy.

In some embodiments, the upper layer is (410) to be a free layer to form a top spin valve or pseudo spin valve configuration for the magnetic storage element. In such case, the process deposits (412) a spacer layer on the free layer. The process then deposits (414) a reference layer on the spacer layer where the reference layer includes a Heusler alloy. As described above, the reference layer may be a multi-layer structure. The process then deposits (416) a capping layer on the reference layer.

In some embodiments, the upper layer is (418) to be a reference layer to form a bottom spin valve configuration magnetic storage element. In such case, the process deposits (420) a spacer layer on the reference layer. The process then deposits (422) a free layer on the spacer layer where the free layer includes a Heusler alloy. The process then deposits (424) a capping layer on the free layer.

In one embodiment, the process can perform the sequence of actions in a different order. In another embodiment, the process can skip one or more of the actions. In other embodiments, one or more of the actions are performed simultaneously. In some embodiments, additional actions can be performed.

In several embodiments, the magnetic storage elements include multi-layer stacked structures with the particular layers depicted in FIGS. 4-6. In other embodiments, additional layers can be included or some of the layers may be omitted. In several embodiments, the additional layers may include one or more intervening layers positioned between the depicted layers. In a number of embodiments, one or more layers may be formed of a Heusler alloy grown epitaxially. In one such embodiment, the Heusler alloy can have be CFMS alloy and/or have a L21/B2 ordering.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A magnetic storage element comprising:
    a substrate comprising NiFe, wherein the substrate comprises a first crystalline structure;
    a seed layer on the substrate, wherein the seed layer is configured to substantially obstruct a transfer of the first crystalline structure to the buffer layer and the upper layer;
    wherein the seed layer is configured to provide a second crystalline structure different from the first crystalline structure;
    a buffer layer on the seed layer, wherein the buffer layer is configured to substantially maintain the second crystalline structure;
    wherein a structure of the buffer layer substantially matches a crystalline structure of the upper layer; and
    an upper layer on the buffer layer, the upper layer comprising a Heusler alloy grown epitaxially.

2. The magnetic storage element of claim 1, wherein the first crystalline structure comprises a face-centered cubic structure, and the second crystalline structure comprises a structure that is about body-centered cubic.

3. The magnetic storage element of claim 1,
    wherein the seed layer comprises a first magnetic sub-layer with an amorphous structure and a second magnetic sub-layer with the second crystalline structure that is about body-centered cubic; and
    wherein the second crystalline structure is developed through a process for changing the amorphous structure of the first magnetic sub-layer, the process selected from the group consisting of an annealing process, a phase change process, a re-crystallization process, and combinations thereof.

4. The magnetic storage element of claim 1:
    wherein the substrate comprises a first crystalline structure; and
    wherein the seed layer and the buffer layer are configured to provide a foundation structure for the Heusler alloy of the upper layer that is different from the first crystalline structure.

5. The magnetic storage element of claim 1:
    wherein the Heusler alloy comprises a L21/B2 ordering; and
    wherein the Heusler alloy comprises preferably, but not limited, a CFMS alloy.

6. The magnetic storage element of claim 1:
    wherein the seed layer comprises substantially magnetic characteristics; and
    wherein the buffer layer comprises substantially non-magnetic characteristics.

7. The magnetic storage element of claim 1:
    wherein the upper layer comprises a free layer comprising the Heusler alloy; and
    wherein the magnetic storage element further comprises:
        a spacer on the free layer;
        a reference layer on the spacer, the reference layer comprising a Heusler alloy; and
        a capping layer on the reference layer.

8. The magnetic storage element of claim 7:
    wherein the Heusler alloy of the free layer comprises a L21/B2 ordering;
    wherein the Heusler alloy of the reference layer comprises a L21/B2 ordering;
    wherein the magnetic storage element further comprises:
        an anti-ferromagnetic layer on the reference layer;
        a non-magnetic coupling layer on the reference layer;
        an anti-ferromagnetically coupled pinned layer on the non-magnetic coupling layer, wherein the reference layer is anti-ferromagnetically coupled via the non-magnetic coupling layer; and
        an anti-ferromagnetic pinning layer on the anti-ferromagnetically coupled pinned layer;
    wherein the capping layer is on the anti-ferromagnetic pinning layer; and
    wherein the Heusler alloy of the reference layer is grown epitaxially.

9. The magnetic storage element of claim 1:
    wherein the upper layer comprises a reference layer, the reference layer comprising the Heusler alloy; and
    wherein the magnetic storage element further comprises:
        a spacer on the reference layer;
        a free layer on the spacer, the free layer comprising a Heusler alloy; and
        a capping layer on the free layer.

10. The magnetic storage element of claim 9:
    wherein the Heusler alloy of the reference layer comprises a L21/B2 ordering;
    wherein the Heusler alloy of the free layer comprises a L21/B2 ordering; and
    wherein the Heusler alloy of the free layer is grown epitaxially.

11. The magnetic storage element of claim 1:
wherein the seed layer comprises a multi-layer structure with one or more materials selected from the group consisting of NiFe, Ta, Ti, amorphous CoFeB, CoFe, a material comprising a magnetic CFMS Heusler alloy, and combinations thereof; and
wherein the buffer layer comprises one or more materials selected from the group consisting of Ta, Ti, Cr, Ru, Cu, Ag, Al, W, a Ta alloy, a Cr alloy, a Ru alloy, a Cu alloy, a Ag alloy, a W alloy, a NiAl alloy, and combinations thereof.

12. The magnetic storage element of claim 1:
wherein the seed layer comprises a multi-layer structure with one or more materials selected from the group consisting of NiFe, Ta, Ti, amorphous CoFeB, CoFe, a material comprising a magnetic CFMS Heusler alloy, and combinations thereof; and
wherein the buffer layer comprises one or more materials selected from the group consisting of Cu2CrAl, Cu2AlSi, a material comprising a non-magnetic Heusler alloy, and combinations thereof.

13. The magnetic storage element of claim 1:
wherein the magnetic storage element is a current perpendicular to plane giant magneto-resistance (GMR) reader;
wherein a shield layer is selected from the group consisting of the substrate, the seed layer, and combinations thereof; and
wherein the shield layer acts as a shield for the GMR reader.

\* \* \* \* \*